United States Patent [19]

Jain

[11] Patent Number: 5,621,241

[45] Date of Patent: Apr. 15, 1997

[54] ENHANCEMENT IN THROUGHPUT AND PLANARITY DURING CMP USING A DIELECTRIC STACK CONTAINING HDP-SIO$_2$ FILMS

[75] Inventor: Manoj K. Jain, Plano, Tex.

[73] Assignee: Texas Instruments Incorporated, Dallas, Tex.

[21] Appl. No.: 476,411

[22] Filed: Jun. 7, 1995

Related U.S. Application Data

[62] Division of Ser. No. 291,636, Aug. 17, 1994, Pat. No. 5,494,854.

[51] Int. Cl.$^6$ ........................................ H01L 23/58
[52] U.S. Cl. .................... 257/632; 257/752; 257/635
[58] Field of Search ................................ 257/645, 632, 257/639, 752, 734, 640, 638, 758, 635

[56] References Cited

U.S. PATENT DOCUMENTS

| | | | |
|---|---|---|---|
| 4,966,865 | 10/1990 | Welch et al. | 257/752 |
| 5,381,046 | 1/1995 | Cederbaum et al. | 257/752 |
| 5,471,091 | 11/1995 | Pasch et al. | 257/752 |
| 5,510,652 | 4/1996 | Burke et al. | 257/752 |

*Primary Examiner*—Mahshid D. Saadat
*Assistant Examiner*—S. V. Clark
*Attorney, Agent, or Firm*—James C. Harris; Richard A. Stoltz; Richard L. Donaldson

[57] ABSTRACT

A semiconductor device and process for making the same are disclosed which uses a dielectric stack to improve fabrication throughput, gap-fill, planarity, and within-wafer uniformity. A gap-fill dielectric layer 34 (which preferably contains an integral seed layer) is first deposited over conductors 22, 24, and 26. Layer 34 is preferably a high density plasma (HDP) silicon dioxide deposition which planarizes high aspect ratio conductors such as 24, 26 but does not necessarily planarize low aspect ratio conductors such as 22. A dielectric polish layer 40, which preferably polishes faster than the gap-fill layer may be deposited over layer 34. The polish layer may be formed, for example, by plasma chemical vapor deposition of TEOS. Finally, a chemical-mechanical polishing process is used to planarize the dielectric stack in a manner which requires a minimal polishing time and produces a highly planarized structure.

5 Claims, 7 Drawing Sheets

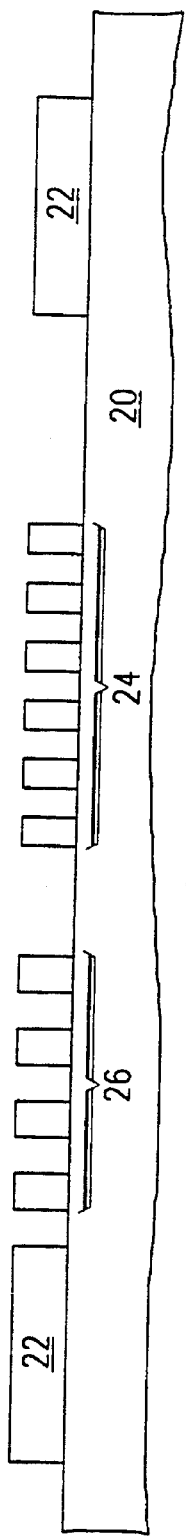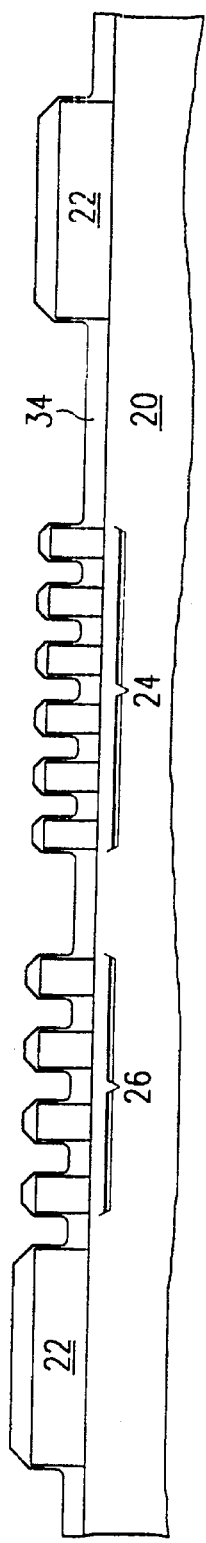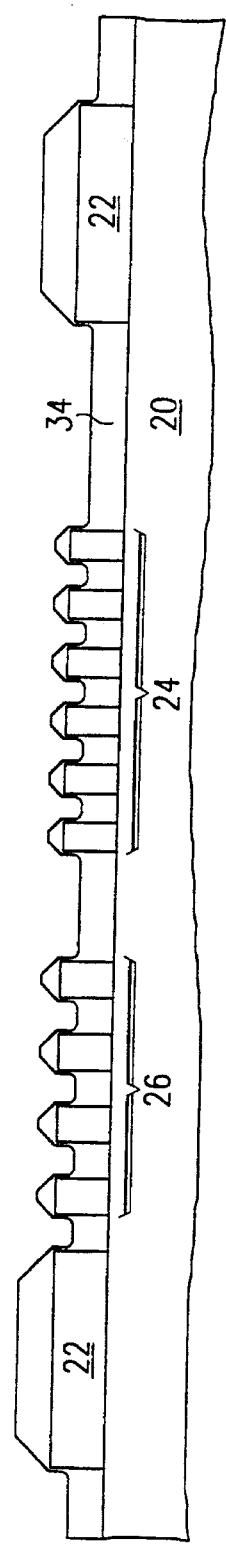

ENHANCEMENT IN THROUGHPUT AND PLANARITY DURING CMP USING A DIELECTRIC STACK CONTAINING HDP-SIO₂ FILMS

This is a division of application Ser. No. 08/291,636, filed Aug. 17, 1994, now U.S. Pat. No. 5,494,854.

FIELD OF THE INVENTION

This invention relates generally to the planarization of dielectrics on semiconductor devices, and more particularly to methods for improving local and global wafer planarity.

BACKGROUND OF THE INVENTION

Semiconductors are widely used in integrated circuits for electronic devices such as computers and televisions. These integrated circuits typically combine thousands or even millions of transistors on a single crystal silicon chip to perform complex functions and store data. As desired storage capacity and functionality always seem to outpace current manufacturing capabilities, a great deal of research in the semiconductor industry has traditionally focused on process improvements which allow for more transistors to be packed onto a chip of a given size. Historically, such process improvements have resulted in roughly a 13% annual decrease in the minimum feature widths achievable for transistors and interconnections.

With current miniaturization and functionality trends have come a corresponding increase in the complexity of interconnect wiring used to route signals across a chip. This wiring, which not too many years ago was limited to a single level of metal conductors, now may contain as many as five (with even more desired) stacked interconnected levels of densely packed conductors. Each level of patterned conductors is typically formed over a preferably planar insulating layer, and then gaps between neighboring conductors are filled with an insulating material such as silicon dioxide. The gap-filling task, unfortunately, becomes more difficult as wiring widths and spacings shrink, since it is generally not desirable to shrink the height (i.e. thickness) of the wiring proportionally. This condition leads to the formation of deep and narrow gaps between conductors which are difficult to fill without creating voids and discontinuities in the insulating material.

Many materials and processes are under development as next generation gap-filling solutions. One promising method is described in U.S. Pat. No. 5,089,442, issued to Olmer on Feb. 18, 1992. The '442 patent discloses a two-step silicon dioxide deposition process. During the first step, dielectric material is simultaneously deposited and sputter etched, i.e. by plasma-enhanced chemical vapor deposition (PECVD) in an externally-applied magnetic field. Sputter etching is claimed to aid gap-filling by removing dielectric material depositing on the top corners of conductors and redepositing a portion of this material in the gaps between conductors. This is said to insure that gaps fill to create a generally V-shaped dielectric surface which is smoother (edges are less sharp) than the shape of the underlying conductors. At some point, the wafer is removed to a conventional PECVD chamber (i.e. without sputter etch capability), where additional oxide is added as a second layer. Optionally, the wafer is then planarized, e.g. by polishing down to the tops of the conductors. One drawback of the '442 method is a relatively low (700 Å/min) net deposition rate for the sputter+deposition step. Another drawback is that the sputter+deposition step does not appear to improve, and indeed appears to impair, dielectric planarity in order to effect a "smoother" surface which does not contain imbedded voids and discontinuities.

SUMMARY OF THE INVENTION

The present invention provides interconnect structures with increased planarity and methods for achieving increased fabrication throughput, good gap fill, and increased planarity and within-wafer uniformity of interconnection layers on semiconductor devices. Planarity is typically quantified by the fractional reduction in size (by a given process) of step (peak-to-valley) heights observed on a wafer. Good dielectric planarity can be of critical importance, particularly if additional conducting layers must be formed over a given interconnection layer. Planarizing is distinguished from smoothing in that smoothing generally reduces the edge slopes of stepped features, while planarizing reduces the relative height of stepped features. Within-wafer uniformity is defined by the standard deviation of a collection of thickness measurements taken across a wafer; thus, this is a measure of slowly-varying changes in thickness. Low standard deviations characterize a process with high within-wafer uniformity, desirable for high resolution lithography and reduction of overetch requirements, among other things. A typical nonuniformity may be produced by chemical-mechanical polishing (CMP), which may result in dielectric thickness variations across the wafer.

High density plasma (HDP) oxide deposition is defined as chemical vapor deposition with simultaneous de-bias sputtering using a mixture of silicon-containing, oxygen-containing, and nonreactive gasses (e.g. a noble gas). This method generally forms a high quality oxide with good thermal stability, low moisture uptake, and fine mechanical properties; in many ways, HDP oxide is similar to a dense, thermally-grown oxide. Apparently, HDP has many advantages over the external magnetic field sputter technique disclosed in the aforementioned '442 patent, including: more practical chamber design, particularly for scaling to larger wafer sizes; deposition rates greater than 5000 Å/min; and a conductor width-dependent planarization property. It is recognized herein that an HDP-SiO₂ deposition technique which employs simultaneous deposition and de-bias sputtering to enhance gap-filling may also lead to increased planarization of an interlayer dielectric, particularly over and around narrow width conductors. Surprisingly, it has been found that a general interlayer dielectric (ILD) approach including forming an HDP oxide gap fill layer by simultaneous CVD/dc-bias sputtering (hereafter referred to as HDP), then forming an insulating polish layer by one of several other methods (e.g. PETEOS, or plasma-enhanced tetraethylorthosilicate, CVD), followed by a relatively short chemical-mechanical polishing of this intermediate structure, may unexpectedly lead to simultaneous improvements in wafer throughput, planarity, and within-wafer uniformity. This may be due in part to several observed attributes, including: complimentary planarization of the HDP and CMP processes (features not well planarized by HDP may be selectively planarized by CMP, and vice-versa); higher observed deposition and polish rates for candidate polish layer materials than for HDP oxide; and lower required original deposition thickness for a given final thickness and planarity.

The present invention provides a method for constructing a planarized interconnection layer on a semiconductor substrate, which may include previously deposited conducting/ insulating layers. The method comprises providing a layer of patterned conductors on the substrate, the conductors preferably deposited to a predetermined thickness above the substrate, and preferably comprising both low-aspect ratio (i.e. height to width ratio less than 0.5) and high-aspect ratio (i.e. height to width ratio greater than 1.0) conductors. The method may further comprise depositing a conformal dielectric seed layer (i.e., without significant backsputter) over the conductors and substrate. The method further comprises depositing a dielectric gap-fill layer over the patterned conductors and substrate, by a method of simultaneous CVD and sputtering. This dielectric deposition method preferably uses a gas mixture comprised of silicon-containing, oxygen-containing, and inert components (and more preferably silane, $O_2$, and a group VIII gas such as argon). The gap-fill layer is preferably deposited over low aspect ratio conductors to at least 1.5 times the thickness as it is deposited over high aspect ratio conductors. The gap fill layer is also preferably deposited to a thickness between 50% and 125% the thickness of the underlying conductors, as measured in one or more gaps between conductors. A soft (easier to polish than the gap-fill layer) conformal dielectric polish layer may then be deposited over the entire structure. If such a polish layer is included, is may be comprised of materials selected from the group consisting of: PETEOS, BPSG, BSG, PSG, silane oxide, and combinations thereof. The method further comprises a relatively short CMP step to complete planarization. By the method of the invention, it may be possible to perform all dielectric depositions in the same reaction chamber.

The present invention also describes a semiconductor structure comprising a layer of patterned conductors, preferably comprising both low and high aspect ratio conductors, formed on a substrate. The structure may further comprise a conformal seed layer, preferably silicon dioxide, deposited over the conductors and the substrate. The structure further comprises a layer of HDP oxide formed over the conductors, deposited over low aspect ratio conductors to at least 1.5 times the thickness as it is deposited over high aspect ratio conductors. The HDP oxide layer is preferably deposited to a thickness between 50% and 125% the thickness of the underlying conductors, as measured in one or more gaps between conductors. The structure may further comprise an oxide polish layer overlying said HDP oxide layer, said polish layer having a substantially planar top surface which is at least 50% of said conductor thickness above the tops of said conductors.

BRIEF DESCRIPTION OF THE DRAWINGS

This invention, including various features and advantages thereof, can be best understood by reference to the following drawings, wherein:

FIGS. 2A–2F are cross-sectional views of a similar layer of conductors, illustrating deposition of an HDP oxide layer at several steps in the deposition process;

DETAILED DESCRIPTION OF THE PREFERRED EMBODIMENTS

Figure 1A:
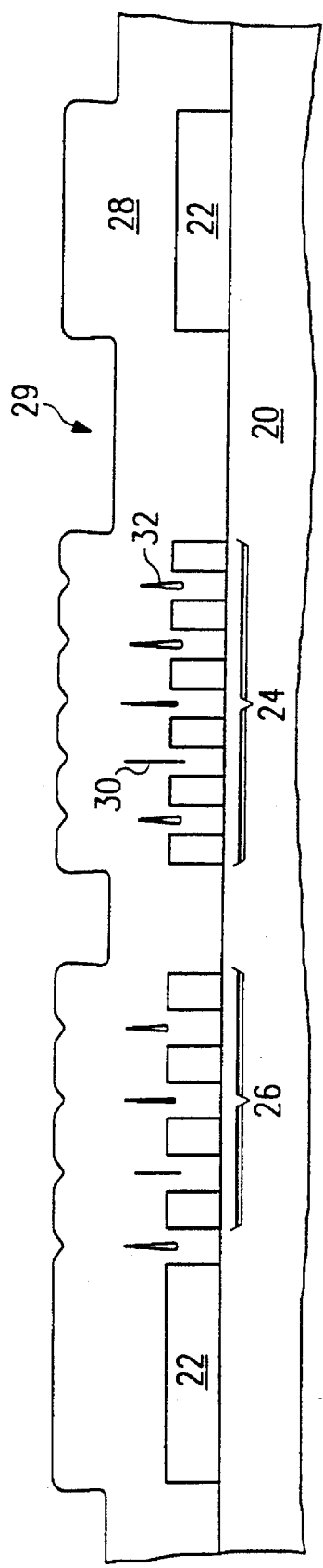
FIGS. 1A–1B are cross-sectional views of a layer of patterned conductors, respectively after conventional PECVD of a dielectric layer and after polishing of the dielectric layer.

Referring now to FIG. 1A, conductors of varying width and an approximate height of 7500 Å are shown in cross-section on a substrate 20. For illustration purposes, specific widths and heights are assigned to conductors and conductor spacing, although the general principles of the invention may be applied to a range of conductor sizes and spacings. Large conductors 22 (e.g. landing pads) have a width of over 3 µm (aspect ratio of less than 0.25). Small conductors 24 have widths and spacings of 0.4 µm (aspect ratio of 1.9), and medium conductors 26 (e.g. supply rails) have widths and spacings of 0.5 µm (aspect ratio of 1.5).

An interlayer dielectric (ILD) 28, deposited by PETEOS CVD, a known process, may resemble that of FIG. 1A after 20,000 Å deposition. For example, the wafer may be placed in an Applied Materials Precision 5000 deposition chamber evacuated to a pressure of roughly 10 torr. A gas mixture of 10% TEOS, 10% O2, and 80% Ar are introduced into an rf plasma in a region just above a wafer heated to approximately 400 C., causing silicon dioxide to deposit on the surface of the wafer at an 8000 to 9000 Å/min rate. Such a process generally will not planarize large gaps, such as gap 29. However, if the deposition thickness generally exceeds half the gap width, dielectric material deposited on the facing walls of adjacent conductors may close the gap from the sides, causing a discontinuity 30. If the top corners of the facing walls receive dielectric material faster than lower portions of the facing walls, it is likely that the top corners will meet first, causing the formation of a void 32. Both discontinuity and void features can adversely affect the local dielectric and mechanical properties of ILD 28.

Figure 9:
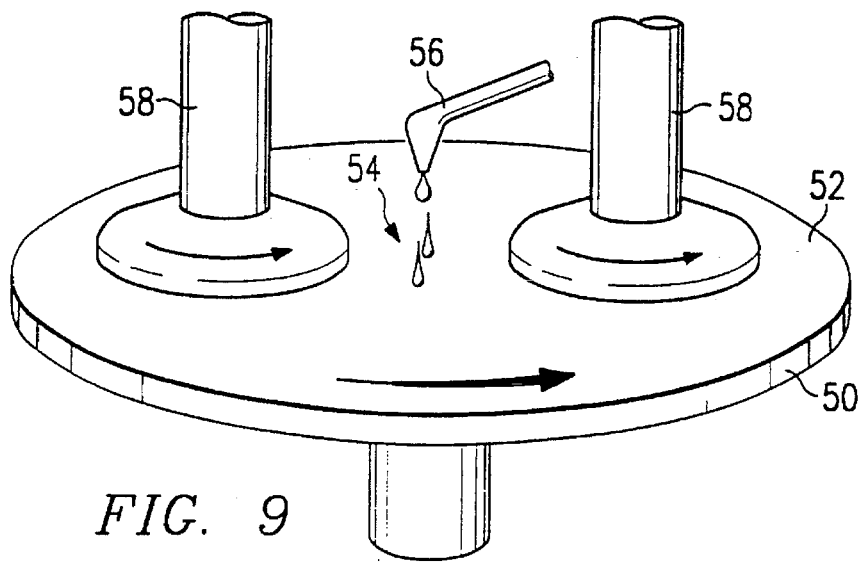
FIG. 9 shows the general arrangement of a chemical-mechanical polishing machine.

Other problems with such a deposition occur because it typically will not planarize the top surface of the ILD, but instead leaves step discontinuities comparable to the height of the underlying conductors. Since it is generally desirable to planarize the top surface as much as possible, CMP may be used to smooth the device topology. For example, the device may be planarized on a commercially available polisher such as the Strasbaugh 6DS-SP, the general arrangement of which is shown in FIG. 9. This polisher has a main platen 50 of 30" diameter covered by one or more polishing pads 52 (e.g. a Rodel Suba IV bottom pad and a Rodel IC 1000 top pad). Polishing slurry 54, typically a basic solution containing a suspension of colloidal silica, is introduced through a feed tube 56 onto the pad at a controlled rate, e.g. 200 ml/min, as the platen is rotated, e.g. at 35 rpm. Wafers are mounted inverted on wafer carriers (two of which exist on the Strasbaugh), or spindles 58, which also rotate, preferably at about 20 rpm. The spindle containing the wafer is pressed against the polishing pad, preferably with a down force of 5 to 6 psi. Under these conditions, polish rates of 1800 to 2000 Å/min are typically observed for PETEOS depositions.

Figure 1B:
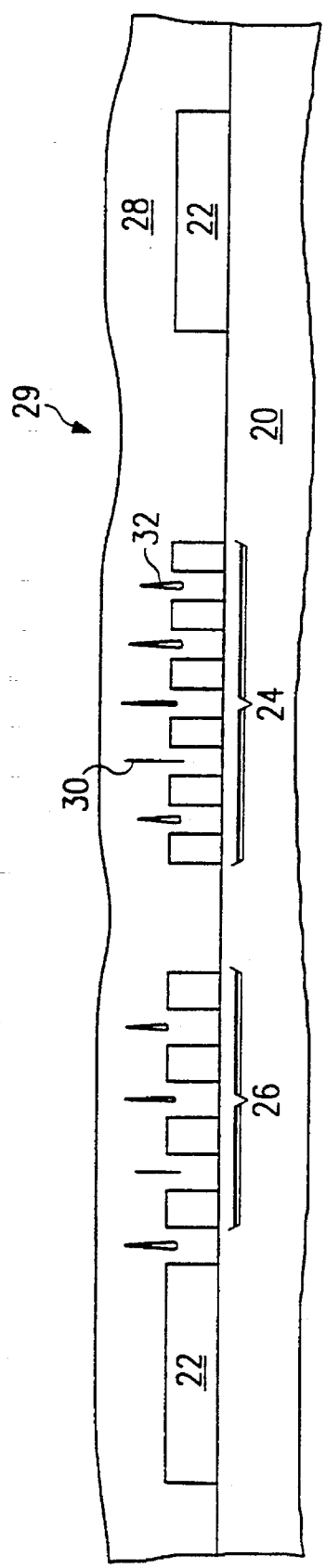

FIG. 1B illustrates the device of FIG. 1A after CMP polishing as described above for 2.5 minutes. Over right large conductor 22, the ILD is within 1500 Å of planarity, but the ILD over small and medium conductors 24 and 26 remains up to 3000 Å from planarity. Local planarity may generally be improved by longer polishing. However, the drawbacks of longer polishing may include: requirement for a thicker initial deposition (since more must be polished off), with greater uncertainty of deposition depth; longer polishing increases uncertainty in the final ILD thickness; both thicker deposition and longer polishing may decrease wafer throughput; and longer polishing tends to be detrimental to within-wafer uniformity (e.g. edges of the wafer may polish more than the center of the wafer). Therefore, even if voids and discontinuities in the ILD can be avoided, it may be impossible to achieve desired planarity, throughput, and within-wafer uniformity goals simultaneously with such a process.

HDP is a relatively new method used for chemical vapor deposition of silicon dioxide. With reference to FIGS. 2A-2F, a set of large, medium, and small conductors similar to those of FIG. 1 are provided on a substrate. Good quality HDP may be deposited, for example, in an Applied Materials deposition chamber using the following procedure: a wafer (containing the substrate) is mounted in the chamber such that backside helium cooling may be used to control temperature; the chamber is then evacuated to 7 millitorr, and a mixture of 68 sccm $O_2$ and 100 sccm Ar are supplied to the chamber; 2500 W of source rf power are used to create a plasma (which also heats the wafer), and the temperature of the wafer is maintained at 330 C. by backside cooling; after 50 seconds of operation, 50 sccm silane is also introduced into the chamber, causing a silane oxide to deposit on the wafer (this step may be used to form an integral seed layer, with a relatively seamless transition to HDP deposition); after 56 seconds of operation, 1600 W of bias power is applied to initiate dc-bias sputtering; at this point, net deposition rate drops to 40 Å/sec, with roughly a 4:1 deposition to sputter ratio. At this rate, an excellent quality oxide may be deposited, although the rate is still substantially lower than, for example, PETEOS. Additionally, this HDP oxide being denser than PETEOS, has been found to have roughly a 25% lower average polish rate. It is believed that sputtering shapes the HDP oxide deposition to roughly a 45 degree angle adjoining the top of a step, e.g., on the top surface where the top and side of a conductor meet.

FIG. 2B illustrates the approximate appearance of an HDP ILD 34 after deposition to a depth of approximately 3000 Å (including, e.g., a 300 Å to 1000 Å integral seed layer). Over large conductors 22, irrespective of spacing from neighboring conductors, ILD deposition depth is 3000 Å, as expected. However, over medium and small conductors 26, 24, maximum deposition depth is unexpectedly only 2200 Å and 1750 Å, respectively. It is believed that because the width of the small conductors 24 is not much more than the 3000 Å deposition depth, ILD 34 has already begun to take on a triangular appearance over these conductors. This is also true of medium conductors 26, though the triangular appearance forms slightly slower and larger. Surprisingly, material is deposited at approximately the same rate in all gaps, irrespective of conductor spacing or the width of adjacent conductors.

FIG. 2C shows the approximate appearance of ILD 34 after continued deposition to a depth of approximately 5000 Å. ILD depth over large conductors 22 is also roughly 5000 Å, but ILD depth over medium and small conductors 26, 24 is still roughly 2200 Å and 1750 Å, respectively. Although not well understood, it is believed that a width-dependent equilibrium point is reached for HDP deposition on the top surface of a stepped feature, after which a net deposition rate near zero is maintained on top of that feature as long as the step persists.

Figure 2D:
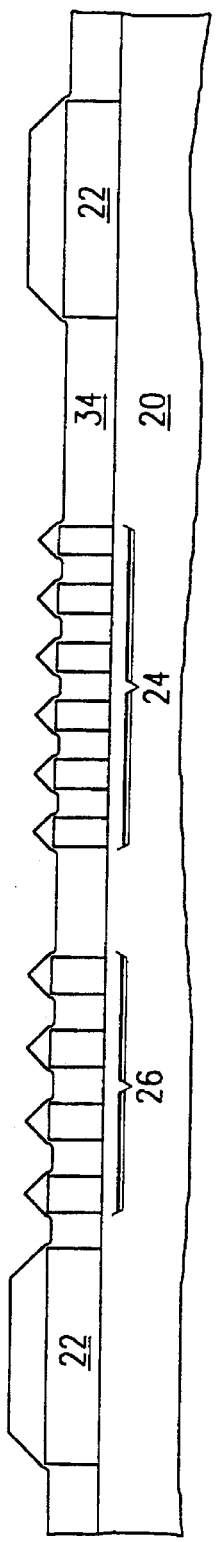

FIG. 2D shows the approximate appearance of ILD 34 after continued deposition to a depth of approximately 7000 Å. Trends similar to those at 5000 Å for conductor coverage are observed, although the shape of the ILD top surface between neighboring small conductors and between neighboring large conductors may begin to smooth as the gaps are almost filled.

Figure 2E:
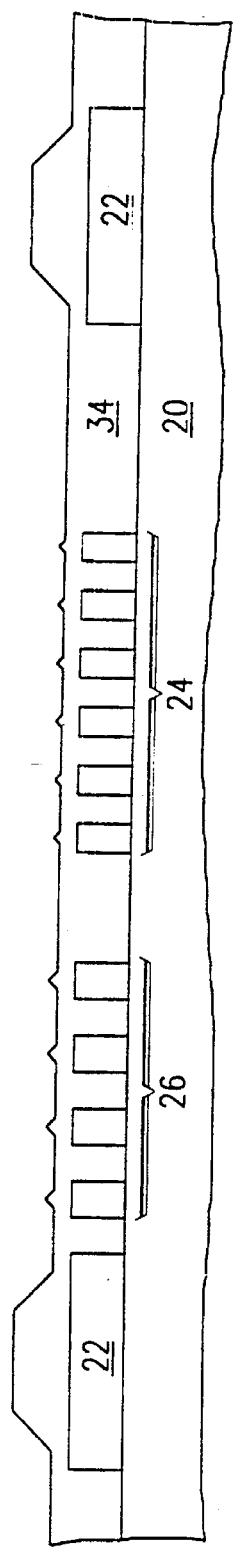

FIG. 2E illustrates the approximate appearance of ILD 34 after continued deposition to a depth of approximately 10000 Å. At this point, the deposition depth exceeds the conductor thickness, and the areas over the small conductors 24 have step heights of only 400 Å. The areas over medium conductors 26 have step heights of only 900 Å. However, the step height over large conductors 22 is still roughly 7500 Å.

Figure 2F:
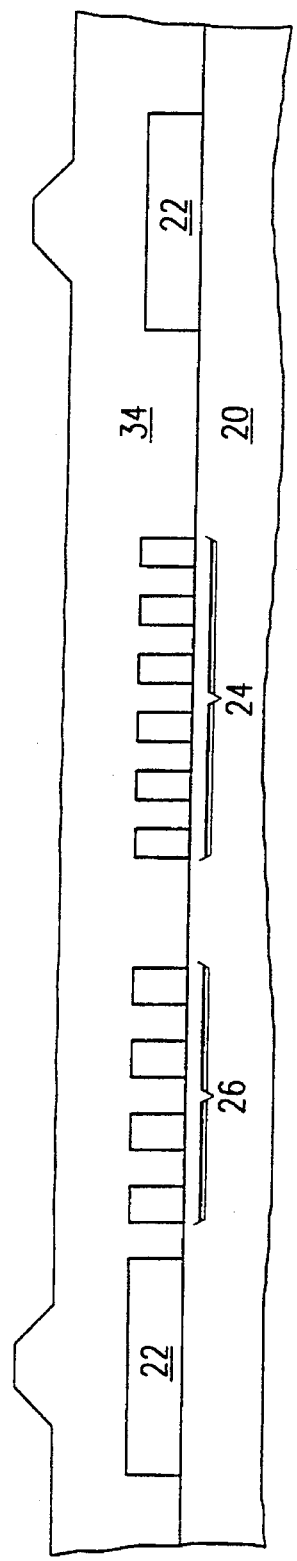

Finally, FIG. 2F shows the approximate appearance of ILD 34 after deposition is stopped at 18000 Å. Even at this depth, the HDP deposition still fails to planarize the ILD over large conductors 22, although the stepped feature may be narrower than the underlying conductor. Surprisingly, the ILD over small and medium conductors has only planarized to roughly 200 Å during this last 8000 Å of deposition, mostly due to smoothing. In general, it has been found that HDP deposition planarizes features according to aspect ratio, high aspect ratio features planarizing first. Features of similar size are planarized at a similar rate, irrespective of gap width surrounding the feature.

EXAMPLE 1

Figure 3:
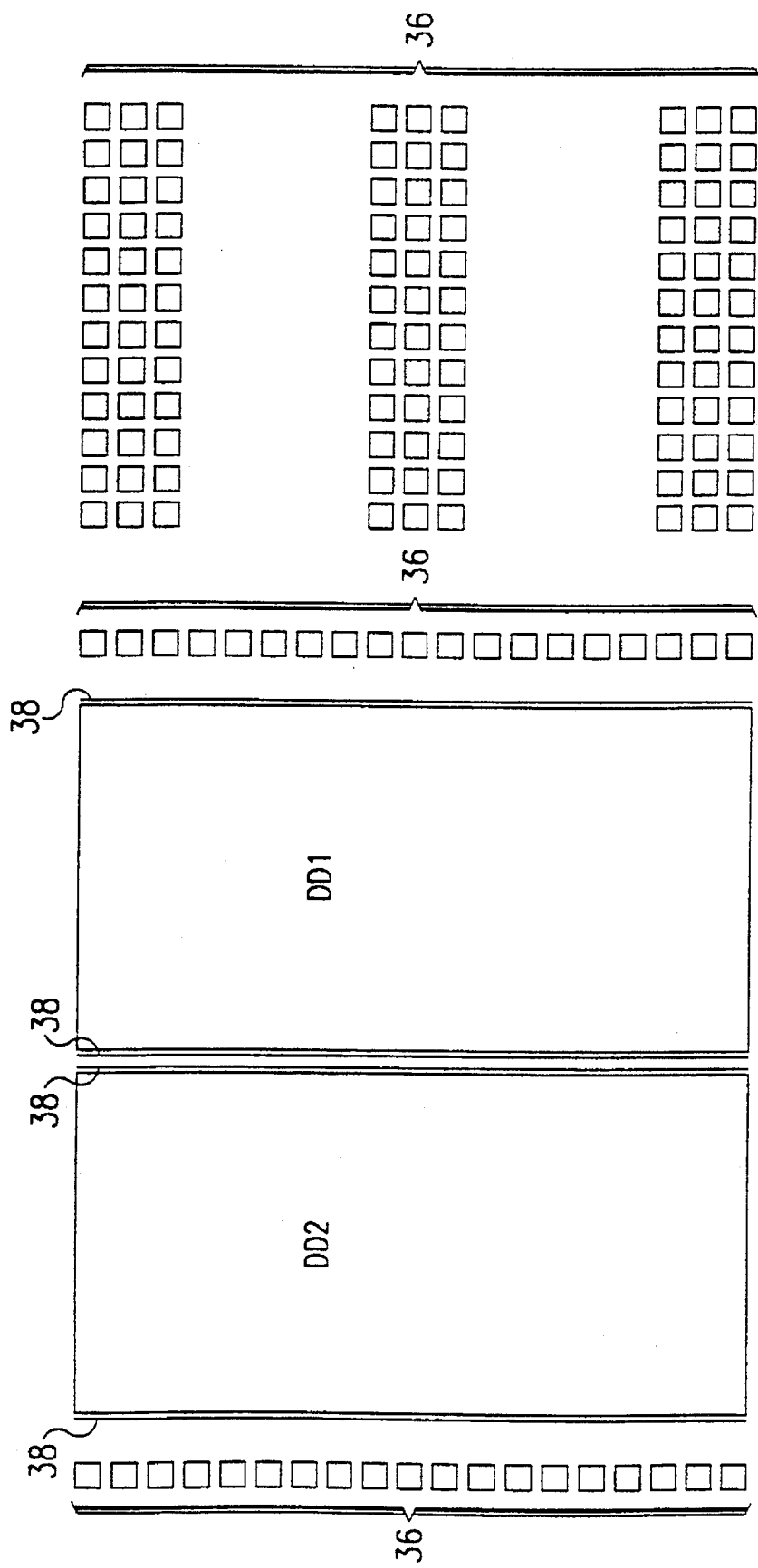
FIG. 3 is a top view of a portion of a test circuit, illustrating the relative position and sizes of several elements of the circuit.

The above HDP process was applied to the metallization test circuit of FIG. 3. This circuit is comprised of various conductor layouts fashioned from an approximately 7500 Å deposition of Aluminum-0.5% Copper alloy. The region labelled DD1 consists of a 1500 μm×3000 μm block structure of regularly spaced conductors, each 0.5 μm wide and 0.5 μm spaced from adjacent conductors. The region labelled DD2 consists of a 1500 μm×3000 μm block structure of regularly spaced conductors, each 0.4 μm wide and 0.4 μm spaced from adjacent conductors. Both DD1 and DD2 are flanked by approximately 10 μm wide distribution rails 38. Additionally, the entire structure is flanked by rows of 110 μm×110 μm bond pads 36, with neighboring pads spaced approximately 50 μm from each other. To the right of the structure a large additional population of bond pads 36 exists.

In this experiment, several wafers containing such a test circuit were first covered by a 1000 Å PETEOS seed layer (such a seed layer may also be a silane oxide layer as described previously). It has been found that such a layer may be beneficial to prevent sputtering of the conductors themselves during HDP deposition. The wafers were then subjected to an HDP deposition process, but for different lengths of time such that wafers were produced with HDP oxide thicknesses of approximately: 3000 Å, 5000 Å, 7500 Å, 10000 Å, and 18000 Å. These wafers were then individually probed by a Tencor P1 profilometer (a device which uses a finely pointed stylus to measure height variations along a surface).

Figure 4:
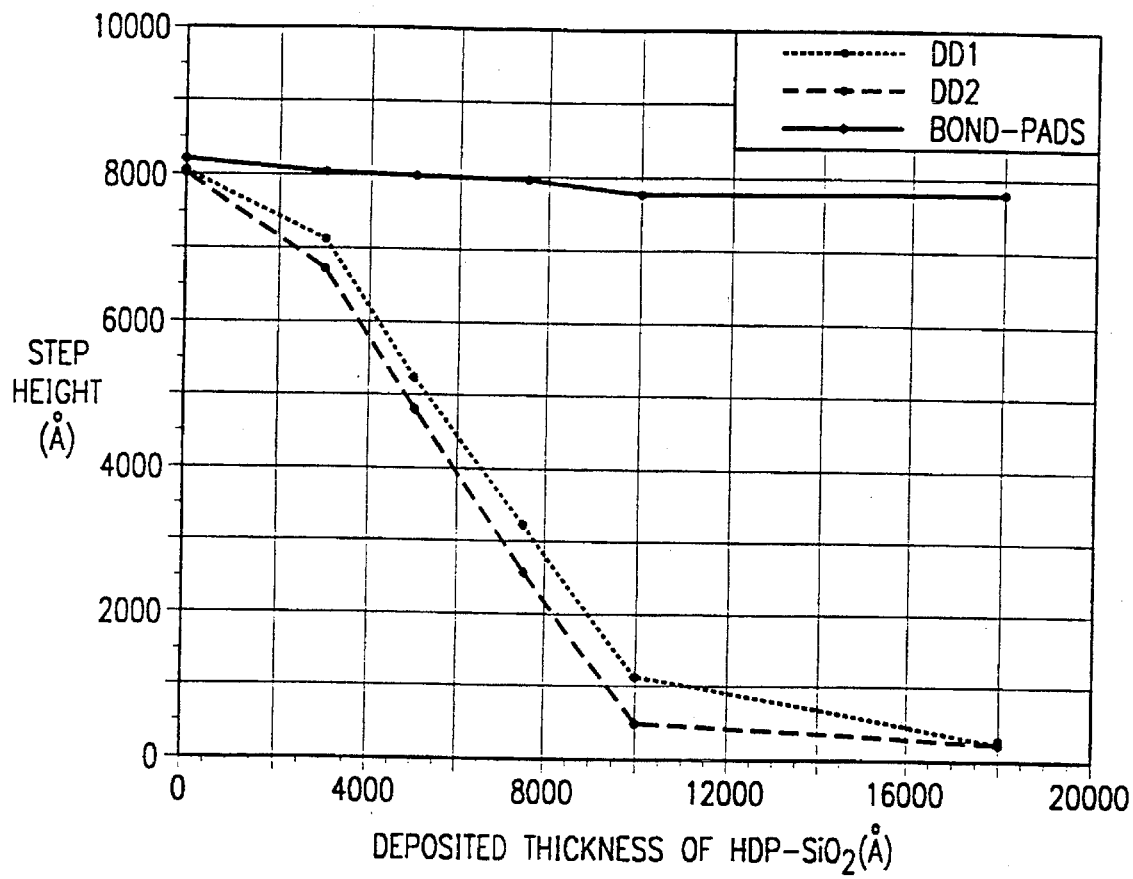
FIG. 4 is a graph of average step height versus HDP oxide deposition thickness for several features present on the same test circuit.

Planarization results obtained from Example 1 are summarized in FIG. 4, which plots step height (as measured from the top of a structure to a nearby area of ILD over substrate) for DD1, DD2, and bond pads 36. A plot for distribution rails 38 is not shown, because it is substantially similar to that shown for the bond pads. All structures began with a measured step height of roughly 8000 Å before HDP deposition. It can be seen from FIG. 4 that from 3000 Å HDP deposition up to roughly 10000 Å deposition, step heights for both DD1 and DD2 follow a linear 1:1 trend; that is, step heights are reduced by roughly the amount of the deposition. However, DD2, with narrower line widths, appears to have entered the linear region first. These observations lend support to the theory of a near zero net deposition rate operating region for deposition on top of narrow structures. Also, note that after 10000 Å, material over and between narrow conductors appears to deposit at roughly the same rate. Bond pads and distribution rails are not substantially planarized, even after 18000 Å deposition.

Figure 5:
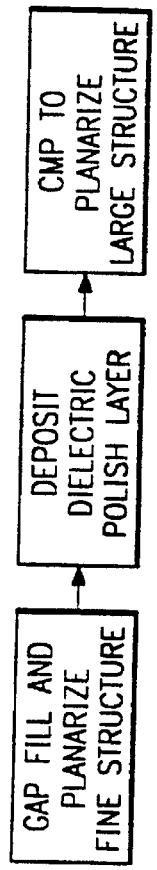
FIG. 5 is a block diagram of one embodiment of the present invention.

It has been found that HDP oxide is generally harder than PETEOS oxide. Under similar polishing conditions, HDP oxide polishes roughly 25% slower than PETEOS oxide. Generally, submicron metallization layers have a large percentage of their surface patterned with densely-packed, high aspect ratio conductors, and a relatively small percentage of their surface patterned with low aspect ratio conductors such as bond pads. These properties, combined with the selective planarization of HDP, have led to an improved ILD structure and method. Referring to FIG. 5, the first step in the new ILD method is an oxide deposition for gap-fill and planarization of fine structure. Secondly, a polish layer of oxide is added. This layer need not particularly planarize or smooth the surface further, but is preferably easier to polish than the gap-fill layer. Finally, a CMP step planarizes the remaining structure, primarily by polishing away a portion of the polish layer, although in some embodiments, some areas of the gap-fill layer may also be polished. The advantages of this method will become apparent during a discussion of FIG. 6.

Figure 6A:
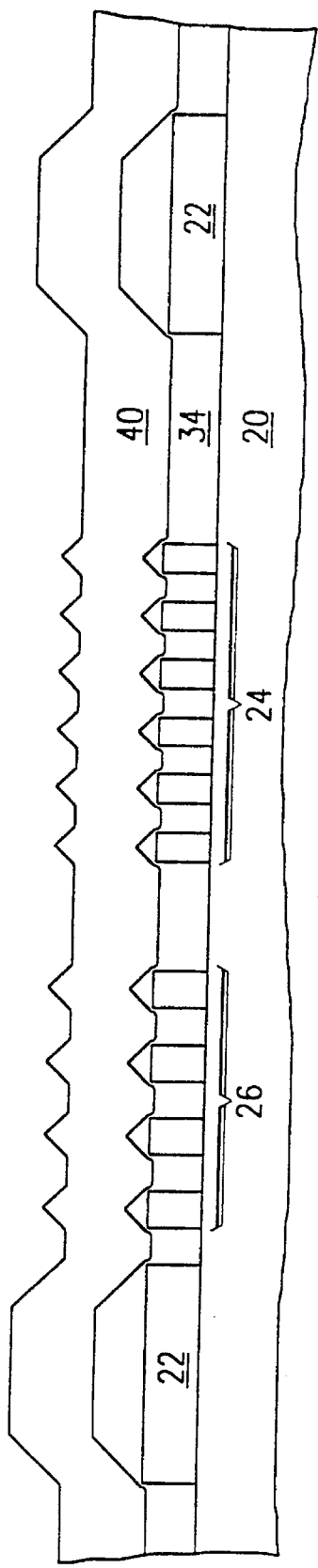
FIGS. 6A–6B are cross-sections of one embodiment of the present invention, respectively before and after CMP.

Referring to FIG. 6A, an intermediate structure of an embodiment of the invention is shown. A gap-fill layer 34 (preferably of HDP oxide with an integral seed layer) is deposited approximately to the height of the conductors. A polish layer 40, possibly of PETEOS, or of a doped oxide such as borophosphosilicate glass (BPSG), borosilicate glass (BSG), or phosphosilicate glass (PSG) is deposited over this structure, preferably in a conformal manner. Alternately, the polish layer may advantageously be comprised of silane oxide deposited in the same chamber as the HDP oxide. The silane oxide may, for example, be deposited using 50 sccm silane and 1000 sccm $N_2O$, at a temperature of 400 C., a pressure of 5 to 10 torr, and an rf power of 400 W. In any case, this layer is preferably easier to polish than and has a higher deposition rate than gap-fill layer 34. Note the differences in cross-section between FIG. 6A and FIG. 1A, which contains only PETEOS. Particularly, in FIG. 1A, a great percentage of ILD 28 is raised and must be polished past the original level of gap 29. In contrast, FIG. 6A has two major protrusions from the surface of layer 40, over large conductors 22. As polishing pressure is applied to the surface of the wafer, force will be concentrated over these protrusion areas (which generally occupy a small fraction of wafer surface area), thus achieving a higher polish rate over the large conductors.

Figure 6B:
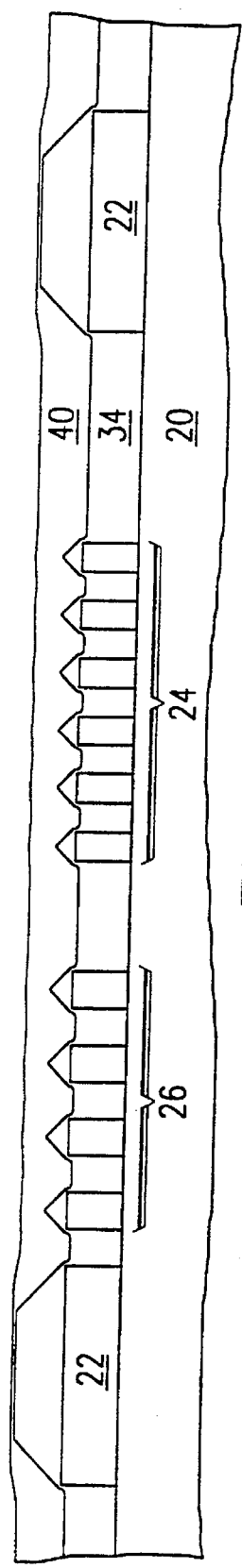

FIG. 6B shows the final ILD structure, ready for further processing. Note that almost the entire polish layer is removed over large-conductor 22, although this may or may not happen on a given embodiment with different gap-fill to polish layer thickness ratio.

EXAMPLE 2

Figure 7:
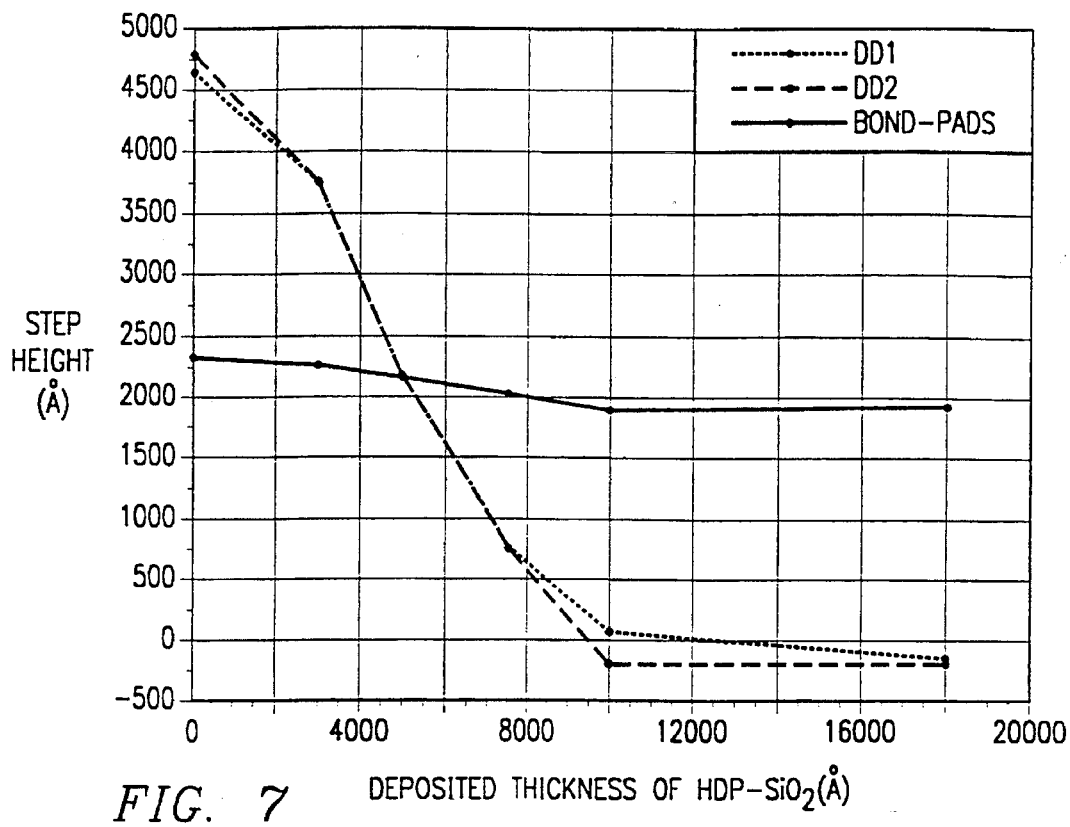
FIGS. 7 and 8 are graphs of average step height for a 19000 Å to 20000 Å dielectric stack vs. thickness of HDP oxide in the stack, after 3000 Å and 5000 Å polish, respectively.
Figure 8:
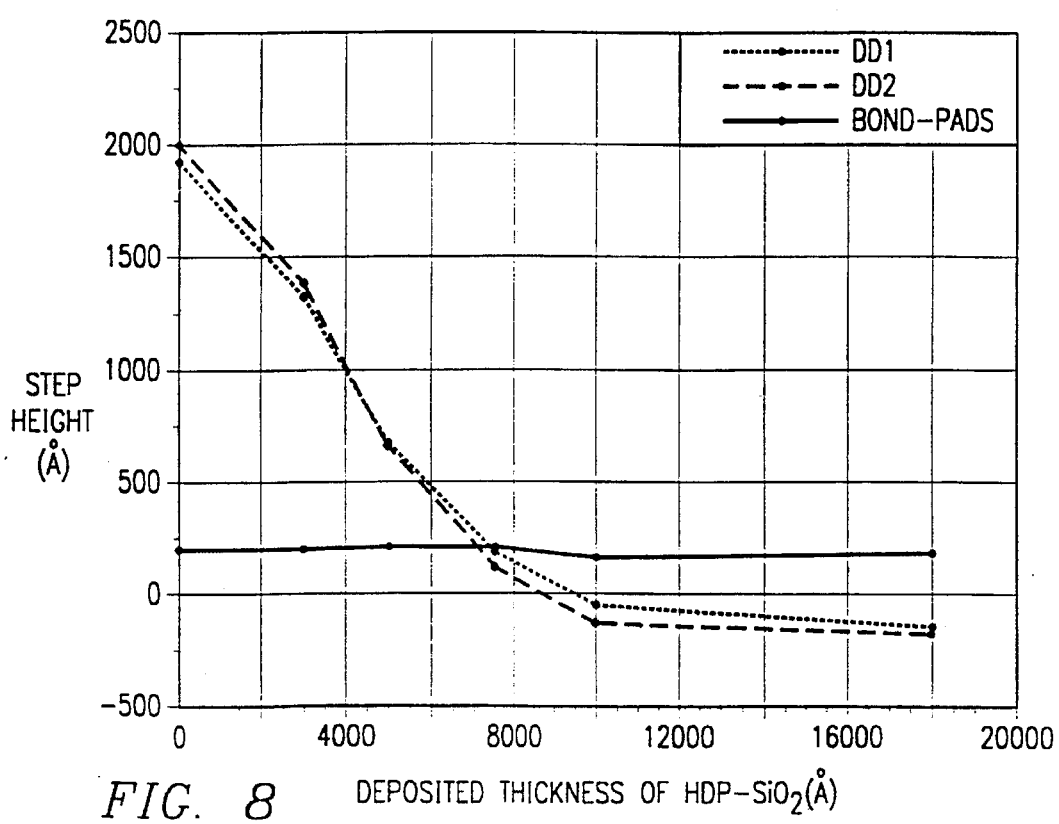

Referring to FIGS. 7 and 8, six identical lots of four test wafers each were configured with the test conductor pattern of FIG. 3. Over each wafer, a silane oxide seed layer, an HDP oxide layer, and a PETEOS polish layer were deposited to the thicknesses shown in Table 1.

TABLE 1

| Lot | Seed Layer (Å) | HDP Layer (Å) | Polish Layer (Å) |
|---|---|---|---|
| 1 | — | — | 18000 |
| 2 | 500 | 3000 | 15000 |
| 3 | 500 | 5000 | 13000 |
| 4 | 500 | 7500 | 10500 |
| 5 | 500 | 10000 | 8000 |
| 6 | 500 | 18000 | — |

Each wafer was polished under identical CMP conditions for a time which would remove 3000 Å from PETEOS deposited on a blank wafer. Step heights of DD1, DD2, and bond pads were measured on each wafer after polishing, and step heights were averaged for each lot to obtain the graph of FIG. 7. Each wafer was polished again, for a time such that a total of 5000 Å of graph of FIG. 7. Each wafer was polished again, for a time such that a total of 5000 Å of PETEOS would be removed from a blank wafer (due to both polishings). Similar step height measurements were compiled to produce FIG. 8.

FIGS. 7 and 8 show that ILD planarity may be increased remarkably over a PETEOS-only process by inclusion of an HDP gap-fill layer. For 3000 Å polish, less than 2200 Å step heights are observed with a 5000 Å HDP layer, vs. almost 5000 Å step heights for an all-PETEOS ILD. For 5000 Å polish, less than 200 Å step heights are observed with a 7500 Å HDP layer, vs. 2000 Å step heights for an all-PETEOS ILD. Note also that for extremely thick HDP depositions, overall planarity after polishing may actually be worse than for intermediate thickness depositions, as indicated by negative step heights, or "dishing", for structures DD1 and DD2 at 10000 Å and 18000 Å HDP thicknesses.

Generally, polishing requirements specify a planarity to be achieved by CMP, and polish time is adjusted to meet the specification. For example, for a 1000 Å planarity specification, 33% higher CMP throughput (including constant handling time) may be gained by using the intermediate ILD structure of lot 3 or 4 instead of lot 1. This throughput may be further increased by use of BPSG or a similar fast-polishing material for the polish layer.

Table 2 provides an overview of some embodiments cross-referenced to the drawings.

TABLE 2

| Drawing Element | Preferred or Specific Examples | Generic Term | Other Alternate Examples |
| --- | --- | --- | --- |
| 20 | $SiO_2$ | Substrate | Other oxides, silicon nitride |
| 22, 24, 26 | AlCu alloy with Ti and/or TiN underlayers | Patterned conductors | Al, Cu, Mo, W, Ti, alloys of these, polysilicon, silicides, nitrides, carbides |
| 28 | PETEOS oxide | Interlevel dielectric | BPSG, BSG, PSG |
| 34 | HDP oxide | Gap-fill layer | |
| 40 | PETEOS oxide | Polish layer | BPSG, BSG, PSG, silane oxide |

The invention is not to be construed as limited to the particular examples described herein, as these are to be regarded as illustrative, rather than restrictive. The invention is intended to cover all processes and structures which do not depart from the spirit and scope of the invention. For example, the soft polish layer may itself be comprised of several sublayers, if desired.

What is claimed is:

1. A semiconductor device having both high and low aspect ratio conductors on a common conducting level, said device comprising:

(a) a layer of patterned conductors formed on a substrate and comprising a plurality of high aspect ratio conductors and a plurality of low aspect ratio conductors, said layer having a first thickness;

(b) an HDP oxide layer overlying said patterned conductors and said substrate, said HDP oxide layer having a second thickness measured over said low aspect ratio conductors and a third thickness measured over said high aspect ratio conductors, said second thickness having a ratio to said third thickness of at least 1.5:1; and (c) an oxide polish layer overlying said HDP oxide layer, said polish layer having a substantially planar top surface, said layer of patterned conductors, HDP oxide layer, and oxide polish layer having a combined thickness of at least 150% of said first thickness.

2. The semiconductor device of claim 1, wherein HDP oxide thickness, as measured in one or more gaps between said patterned conductors, is between 50% and 125% of said first thickness.

3. The semiconductor device of claim 1, further comprising a conformal dielectric seed layer overlying said patterned conductors and said substrate, and underlying said HDP oxide layer.

4. The semiconductor device of claim 3, wherein said conformal dielectric seed layer has a thickness of 300 Å to 1000 Å.

5. The semiconductor device of claim 1, wherein said oxide polish layer is comprised of materials selected from the group consisting of: PETEOS, BPSG, BSG, PSG, silane oxide, and combinations thereof.

* * * * *